United States Patent [19]

Harlan

[11] Patent Number: 5,595,602
[45] Date of Patent: Jan. 21, 1997

[54] DIFFUSER FOR UNIFORM GAS DISTRIBUTION IN SEMICONDUCTOR PROCESSING AND METHOD FOR USING THE SAME

[75] Inventor: Kent S. Harlan, Austin, Tex.

[73] Assignee: Motorola, Inc., Schaumburg, Ill.

[21] Appl. No.: 514,634

[22] Filed: Aug. 14, 1995

[51] Int. Cl.⁶ .................................................. C23C 16/00
[52] U.S. Cl. .................... 118/715; 118/723 ME; 118/723 MP; 118/723 R; 427/248.1; 427/255.1
[58] Field of Search .................... 118/715, 723 ME, 118/723 MP, 723 R; 427/248.1, 255.1

[56] References Cited

U.S. PATENT DOCUMENTS

| | | | |
|---|---|---|---|
| 2,103,623 | 12/1937 | Kott | 118/723 R |
| 4,367,114 | 1/1983 | Steinberg et al. | 156/345 |
| 4,612,077 | 9/1986 | Tracy et al. | 156/345 |
| 4,792,378 | 12/1988 | Rose et al. | 156/643 |
| 5,136,975 | 8/1992 | Bartholomew et al. | 118/715 |
| 5,227,340 | 7/1993 | Pintchovski et al. | 437/225 |
| 5,302,424 | 4/1994 | Murai et al. | 427/131 |

Primary Examiner—Robert Kunemund
Assistant Examiner—Felisa Garrett

[57] ABSTRACT

Uniform distribution of a gas flow into a closed chamber (16) of semiconductor process equipment is enabled by using a porous sintered diffuser plate (30) having a preselected porosity and thickness as a gas diffuser. The porous diffuser plate is positioned in the equipment between the gas inlet (22) and the surface of a semiconductor wafer (18) such that the incoming gas must flow through the porous diffuser plate. In this manner, the gas is uniformly diffused through the plate due to its porous nature. As the gas exits the porous sintered plate on its bottom surface, the flow is laminar across the entire bottom surface of the porous plate. The semiconductor wafer is set a predetermined distance away from the bottom surface of the porous sintered plate where the gas supplied to its surface is uniform across the wafer surface.

18 Claims, 2 Drawing Sheets

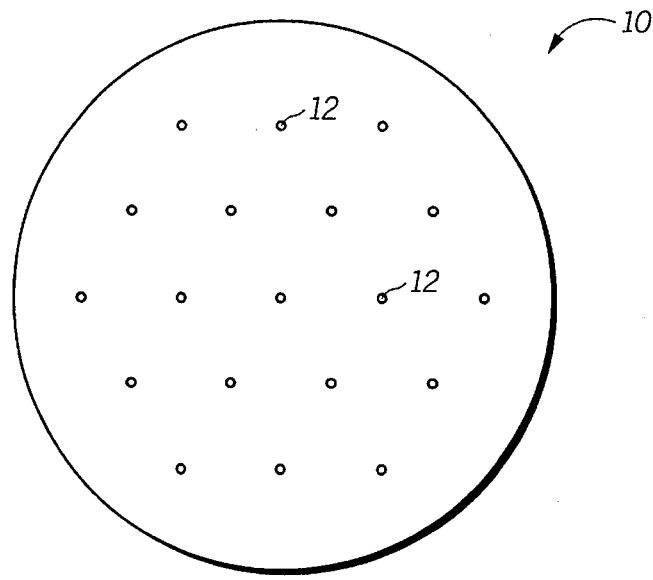
FIG.1
-PRIOR ART-
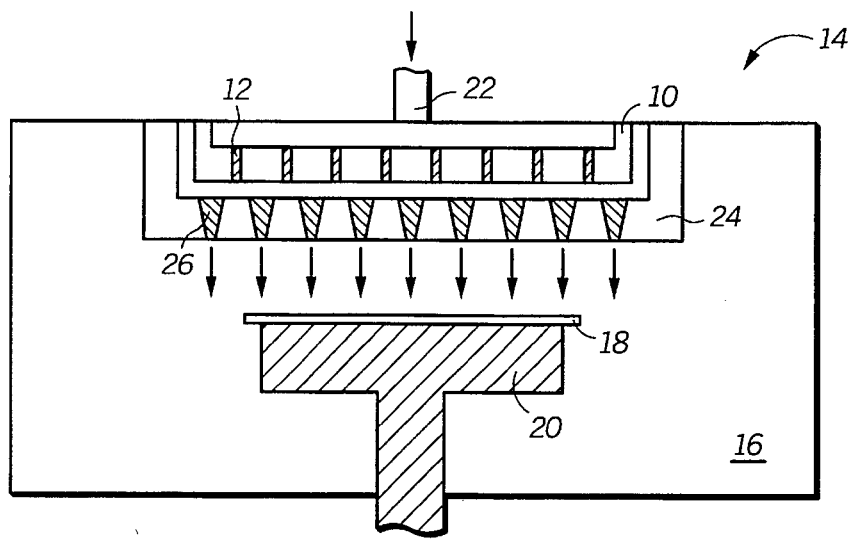
FIG.2
-PRIOR ART-
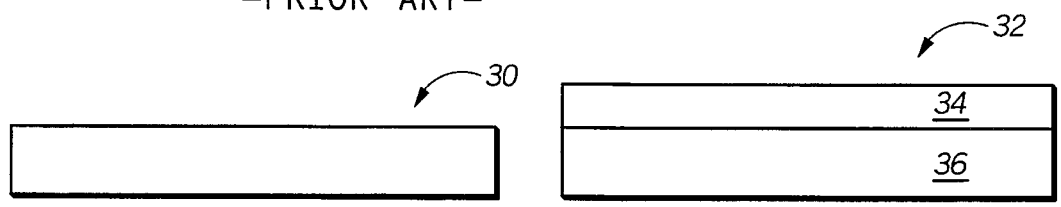
FIG.3          FIG.4

DIFFUSER FOR UNIFORM GAS DISTRIBUTION IN SEMICONDUCTOR PROCESSING AND METHOD FOR USING THE SAME

FIELD OF THE INVENTION

The present invention relates generally to semiconductor processing, and more specifically to a method for uniformly distributing gas in a closed chamber.

BACKGROUND OF THE INVENTION

The field of semiconductor processing has been facilitated by the use of plasma reactors, and similar equipment. In fabricating semiconductor integrated circuits, plasma reactor equipment is employed for depositing layers or films of conductive material, semiconductor material, or insulating materials in various patterns, configurations, and thicknesses to form microcircuits. Dry etching of semiconductor materials can also be conducted with chemical vapor transport systems to selectively remove desired areas of such materials to form the requisite patterns or configurations. The use of these aforementioned equipment often requires various gases to be introduced into a contained environment into which a semiconductor wafer has been placed to form microcircuits. Typically, the contained environment is a plasma chamber of the equipment. The gas is desired to be uniformly distributed over the surface of the semiconductor wafer inside the chamber for purposes of deposition, etch, or another wafer fabrication process. The reason for desiring uniform gas distribution is that variations in the gas flow across the surface of the wafer result in nonuniform deposition or etch causing nonplanar topography which can lead to yield loss, incomplete etch, and consequently device failures.

The current accepted method of distributing the flow of gases in a plasma chamber is through the use of multistage gas dispersion disks. One such gas dispersion disk is shown in FIG. 1, wherein the disk 10 has a plurality of holes 12 in the disk. The holes 12 are in practice drilled in precise locations per a specific hole pattern. The specific hole patterns are proprietary to each semiconductor device manufacturer because the hole patterns are typically experimentally determined to yield the most uniform gas distribution for that company's plasma reactor equipment configuration.

Multiple gas dispersion disks are currently used together to more evenly diffuse the incoming gas, as illustrated in FIG. 2, which is a cross-sectional schematic of a plasma reactor 14. The plasma reactor 14 has a reactor chamber 16 which contains a semiconductor wafer 18 supported by a susceptor or pedestal 20. There is a gas inlet 22 at the top of the reactor chamber 16. The incoming gas is dispersed through two gas dispersion disks, wherein the top disk 10 will be referred to as a blocker plate or a pre-diffuser, and the bottom disk 24 will be referred to as a face plate or electrode. Often, the holes 26 in the face plate 24 are tapered, as illustrated, to better disperse the gas exiting holes 26 which are themselves positioned above the surface of the semiconductor wafer 18. Alternatively, the holes can be counterbored such that the top portion of holes are larger than the bottom portion at the exit surface.

This gas dispersion technique has several disadvantages. One disadvantage is that these plates with the company proprietary hole patterns are very expensive due to the manufacturing process required to drill the holes. Furthermore, these plates are often made of anodized aluminum for increased life, and the anodization process itself is costly. Additionally, an increase in the diameter of the semiconductor wafer exacerbates the nonuniform flow problems especially at the edges of the wafer. For example, the gas flow may be laminar at the center of the wafer surface but is turbulent at the edges. Furthermore, process drift occurs over time and the flow pattern changes leading to variability in the process. In addition, the holes clog after a time in manufacturing leading to undesirable flow patterns and results. Yet another problem is that multiple gas dispersion disks must be used in order to more evenly distribute the gas, but the fluid flow dynamics become extremely difficult to accurately model to determine the optimum patterns to achieve laminar flow. Added to this problem is the difficulty in alignment of multiple disks to get the various hole patterns aligned correctly with respect to each other to achieve laminar flow. Furthermore, in etch, the face plates erode over time so they have to be replaced which adds yet another area of variability in the process where tight process control is critical due to the submicron dimensions involved in building microcircuits.

Thus, a need exists for being able to uniformly distribute gas for any semiconductor process requiring laminar flow over a large surface area without needing expensive plates having proprietary hole patterns which are costly and inefficient.

BRIEF DESCRIPTION OF THE DRAWINGS

FIG. 1 illustrates, in a top view, a gas dispersion disk having a pattern of holes as known in the prior art.

FIG. 2 illustrates, in cross-section, a schematic of a plasma chamber having a two-stage gas dispersion, as the typical prior art method for gas distribution.

FIG. 3 illustrates, in cross-section, a diffuser for uniform gas distribution in semiconductor processing in accordance with an embodiment of the invention.

FIG. 4 illustrates, in cross-section, a diffuser composed of two layers of materials having different porosities for uniform gas distribution in semiconductor processing in another embodiment of the invention.

DETAILED DESCRIPTION OF A PREFERRED EMBODIMENT

Figure 5:
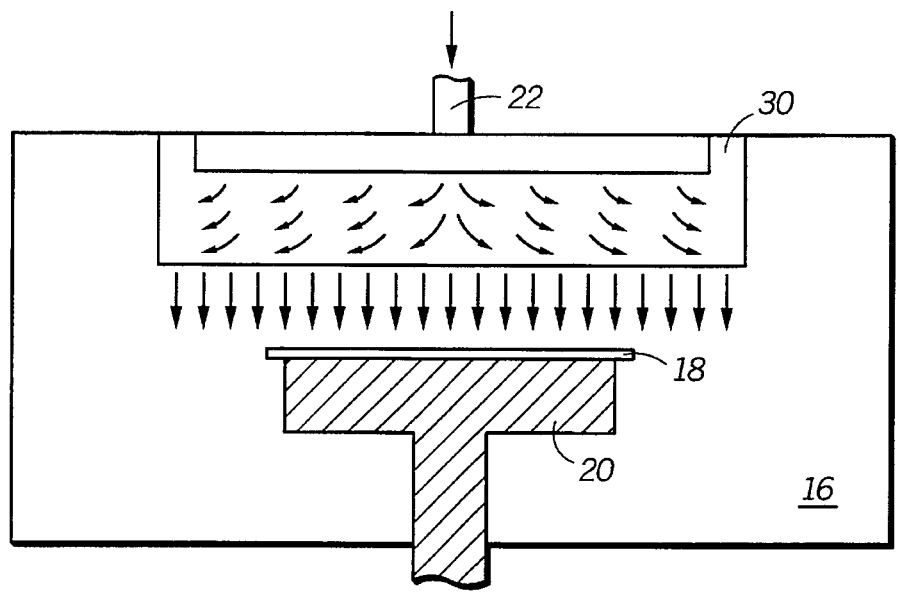
FIG. 5 illustrates, in cross-section, a schematic of a plasma chamber utilizing the diffuser of FIG. 3, in accordance with a method of using the diffuser to uniformly distribute incoming gas for semiconductor processing.

Generally, the invention provides a method for uniformly distributing a gas flow into an enclosed environment, such as a plasma chamber of CVD equipment, for semiconductor processing applications. The method involves using a porous sintered plate having a preselected porosity and thickness as a gas diffuser. The porous sintered plate is positioned in the CVD equipment between the gas inlet and the surface of a semiconductor wafer such that the incoming gas must flow through the porous sintered plate. In this manner, the incoming gas is uniformly diffused through the thickness of the sintered plate due to its porous nature. As the incoming gas exits the porous sintered plate on its bottom surface, the gas is uniformly distributed such that laminar flow is maintained across the entire surface of the porous sintered plate. The semiconductor wafer is supported by a pedestal or susceptor set a predetermined distance away from the bottom surface of the porous sintered plate. The incoming gas necessary for the preselected semiconductor process is uniformly distributed over the surface of the semiconductor wafer for the applicable semiconductor process.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

FIGS. 3 and 4 illustrate, in cross-section, two embodiments of a diffuser for uniformly distributing gas in semiconductor processing in accordance with the present invention. In FIG. 3, the gas diffuser plate 30 is composed of a porous sintered material. Examples of suitable materials include, but are not limited to, stainless steel, aluminum, nickel, ceramic, and any alloy thereof. Sintered metals are preferable over ceramics for a CVD environment, whereas ceramics are more desirable in etch or a magnetically enhanced environment. A major difference and advantage of the present diffuser 30 over the prior art is that there are no holes required to disperse incoming gas. The porosity of the sintered plate intrinsically distributes the gas through the plate in a uniform fashion. The more homogeneous the sintered plate is, the more evenly the gas will be distributed therethrough. The elimination of the holes means that specific company proprietary hole patterns are avoided. Furthermore, fluid dynamic modeling and experimentation of different hole patterns for a particular plate size to achieve laminar flow are eliminated. Additionally, the prohibitively expensive cost of drilling particular patterns of small holes, especially tapered holes, is eliminated.

The gas diffuser plate 30 of the present invention is manufactured through a sintering process, that allows one to control the desired porosity of the final sintered product. It is important that the sintering process produces a final product that is homogeneously porous for uniform diffusion. It is expected that a porosity ranging from 0.2 µm to 5 µm would be most applicable in the field of semiconductor processing, where the relevant processes requiring laminar gas flow include CVD, etch, and implant. For example, the etching process requires a smaller porosity than does deposition of tetraethyl orthosilicate (TEOS), both in the submicron range, while implanting can be performed with relatively large pore sizes, in the micron range. While a practicable range is specified for practicing the invention, the spirit of the invention does not preclude other porosity ranges from being used as long as the resulting flow can be maintained as laminar flow. Turbulent flow is to be avoided because it produces irregular topographies on the surface of the semiconductor wafer.

In FIG. 4, a sandwich of two different porosity layers is used to form a gas diffuser plate 32. This multilayer gas diffuser 32 may either be a single sintered product having two layers of porous materials, or it may be two separate single layer diffusers used in conjunction with each other to further diffuse the incoming gas through the diffuser 32. It should be noted that the different layers of materials have different predetermined porosity levels. For example, the top layer 34 may have a predetermined porosity level of 0.2 µm while the bottom layer 36 may have a predetermined porosity level of 0.5 to 5 µm. Having a smaller pore size in the upper layer creates more back pressure with the incoming gas which serves for better pre-distribution of the gas, so that the resulting flow exiting the diffuser is more uniform across the entire surface of the disk. The same materials as discussed above for diffuser 30 may be used to form multilayer diffuser 32. It is expected that the top layer 34 can be thinner than the bottom layer 34, although it is not a requirement in practicing the present invention. For example, a 1.6 mm (0.0625 inch) layer may suffice for top layer 34 while a 3.2 mm (0.125 inch) layer may suffice for bottom layer 36. Of course, it is possible to vary the thicknesses of the layers as desired for the applicable semiconductor process.

Additionally, while FIG. 4 only illustrates two layers of porous materials used to form a multilayer gas diffuser, it should be understood that additional layers of different porosities may be added to the gas diffuser to achieve the desired diffusive effect to obtain laminar flow. For example, if the surface area requiring laminar gas flow is very large, substantially larger than either 8 inch to 10 inch (200 to 250 mm) wafers, it may be necessary to add more porous layers to achieve the desired laminar flow because increases in surface area exacerbates the fluid flow problems around the edges of the area. Thus, it may become desirable to use a single layer gas diffuser plate having a first porosity as a blocker plate and an additional single layer or multilayer gas diffuser having a different porosity as a face plate (the terminologies having been explained in the background of the invention). Alternatively, a multilayer gas diffuser can also be used as a blocker plate. Additionally, it should be noted that different materials combinations are also possible in practicing the invention. For example, a sintered metal blocker plate could be used in conjunction with a ceramic face plate, or vice versa. Or, two different type of sintered metals or sintered metal alloys can be used for the blocker plate and face plate.

FIG. 5 illustrates, in cross-section, a schematic of a plasma chamber utilizing the diffuser of FIG. 3, in accordance with a method of using the diffuser to uniformly distribute incoming gas for semiconductor processing. The diffuser 30 is placed in the top portion of the plasma chamber such that the gas inlet must introduce the incoming gas through the diffuser 30. The diffuser 30 is a porous sintered disk, so that there are voids within the material itself. There is no hole pattern associated with this diffuser. Instead, the voids are substantially homogeneously distributed within the diffuser plate itself by virtue of the porous nature of the sintered material. In this manner, incoming gas is distributed through the diffuser by flowing through the voids in within the diffuser. This dispersive effect slows the velocity of the incoming gas such that upon its exit at the bottom surface of the diffuser, the gas velocity is sufficiently slow to maintain laminar flow across the entire surface area of the diffuser, as indicated by the arrows in FIG. 5. The semiconductor wafer 18 is supported by susceptor or pedestal 20 within the plasma chamber. The susceptor 20 is a standard fixture within either the CVD or etch equipment themselves.

A major advantage to incorporating the use of the diffuser 30 in a CVD process is the uniform distribution of the incoming gas across the surface of the semiconductor wafer. The flow is laminar across the entire surface of the diffuser, even across a large surface area, whereas the prior art method of using a pattern of holes means that as the surface area of disk increases, the hole pattern must be changed in order to maintain some uniformity in the flow. However, changing the hole pattern would require remodeling of the fluid dynamics which would still not yield as uniform of a flow as the porous sintered diffuser of the present invention. An additional benefit of utilizing the porous sintered diffuser in the present method is that the incoming gas is also filtered for particulates, leading to cleaner gas for the vapor deposition or etch processes.

Of course, it should be understood that use of the diffuser 30 or 32 is in no way limited to a CVD process, because the diffuser 30 can also be used in an etch process. Typical etch equipment requires multiple baffles having specific hole patterns to achieve uniform gas flow, similar to the CVD equipment using multistage gas dispersion disks, which poses serious fluid modeling and aligning of multiple baffles problems. Thus, using the diffuser 30 of the present invention in an etch process will greatly simplify the etch process while providing laminar gas flow with no alignment difficulties, regardless of how many baffles are required.

Figure 6:
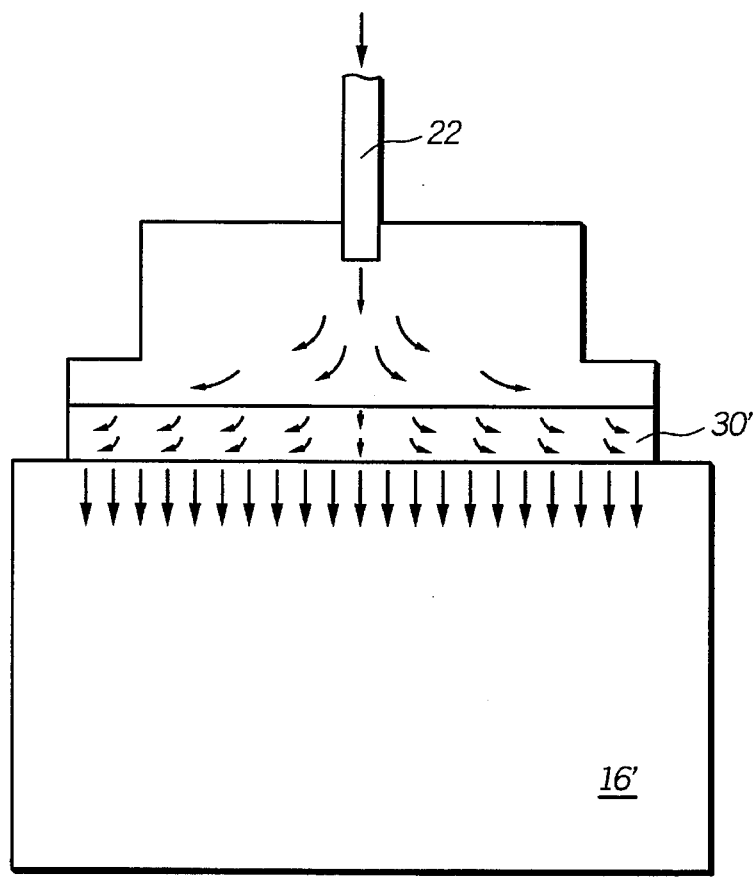
FIG. 6 illustrates, in cross-section, a schematic of a closed chamber utilizing the diffuser of FIG. 3, in an alternative method of using the diffuser to uniformly distribute incoming gas.

Additionally, FIG. 6 illustrates, in cross-section, a schematic of a closed chamber utilizing the diffuser of FIG. 3, in an alternative method of using the diffuser to uniformly distribute incoming gas. In this instance, the diffuser is placed outside of the chamber but the gas inlet is still positioned such that the incoming gas must pass through the diffuser before entering the chamber. This is an effective and non-disruptive method of introducing gas into any vacuum chamber. This method of practicing the present invention enables a low velocity, high volume flow which is key in providing minimal disruption of particulate matter within the chamber. Functionally, the operation of the gas diffuser is the same as discussed above. This particular configuration, wherein the diffuser is mounted outside of the chamber, may be more desirable when the chamber is small due to the space constraint. Although not specifically illustrated, it is understood that a multilayer diffuser having different porosity layers, different materials, or any combination thereof, may also be used in conjunction with this embodiment to provide uniform gas flow through the diffuser into the chamber.

The foregoing description and illustrations contained herein demonstrate many of the advantages associated with the present invention. In particular, it has been revealed that a porous sintered plate may be used as a gas diffuser in a semiconductor process where laminar gas flow over a semiconductor wafer is required. Moreover, the porosity of the gas diffuser may be varied depending on the particular process requirements and the size of the surface area of the semiconductor wafer. Yet another advantage is that the present invention eliminates the expensive tapered hole drilling process, as well as the use of any particular hole pattern, whether proprietary or not. Furthermore, particulates are pre-filtered out of the incoming gas as an added benefit. Additionally, the low velocity flow afforded by practicing the present invention minimizes the disruption of the particulates already present inside the closed chamber. The gas diffuser is easy to implement across a wide variety of semiconductor processes and equipment.

Thus it is apparent that there has been provided, in accordance with the invention, a gas diffuser composed of a porous sintered material and a method for its use that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the gas diffuser may be a simple plate that is assembled into a clamp ring for attachment to a CVD chamber, or the gas diffuser may be constructed as a single unit having a clamp ring integrally made with the diffuser. In addition, the invention is not limited to a deposition process, but may also be used in conjunction with an etch process, or any other semiconductor manufacturing process where uniform or laminar gas flow is required. It is also important to note that the present invention is not limited in any way to any particular type of semiconductor equipment but may rather be used in conjunction with any closed chamber where the gas diffuser may be fitted below the gas inlet. Furthermore, in the multilayer gas diffuser configuration, the various layers may abut each other or they may be separated by an air gap. A separation between layers should pose no alignment problems as experienced in the prior art because there are no hole patterns to align since all layers are presumed to be homogeneously porous within each layer. Therefore, it is intended that this invention encompasses all such variations and modifications falling within the scope of the appended claims.

I claim:

1. A method of diffusing gas in a semiconductor process, comprising the steps of:

providing a chamber for a semiconductor process, the chamber having a blocking plate and a porous sintered face plate, the porous sintered face plate having an exit surface;

placing a semiconductor wafer within the chamber, wherein the porous sintered face plate lies between the semiconductor wafer and the blocking plate; and introducing a gas into the chamber, wherein the gas introduced into the chamber flows through the porous sintered face plate, and wherein a portion of the gas flowing through the porous sintered face plate flows horizontally through the porous sintered face plate before exiting through the exit surface of the porous sintered face plate.

2. The method of claim 1, wherein the step of providing the chamber comprises providing a plasma reactor chamber.

3. The method of claim 2, wherein the step of providing the plasma reactor chamber the porous sintered face plate is further characterized as a ceramic face plate.

4. The method of claim 1, wherein the step of providing the chamber is further characterized as providing a deposition chamber.

5. The method of claim 4, wherein the step of providing the deposition chamber the porous sintered face plate is further characterized as having a porosity ranging from approximately 0.2 µm to 5 µm.

6. The method of claim 1, further comprising the step of:

using the gas to deposit a layer of material on the semiconductor wafer.

7. The method of claim 1, further comprising the step of:

using the gas to etch a layer of material on the semiconductor wafer.

8. A method of diffusing gas in a semiconductor process, comprising the steps of:

providing a plasma chamber for a semiconductor process, the plasma chamber having a porous sintered blocker plate and a porous sintered face plate lying therein, the porous sintered face plate having an exit surface;

placing a semiconductor wafer within the plasma chamber, wherein the porous sintered face plate lies between the semiconductor wafer and the porous sintered blocker plate; and introducing a gas into the chamber, wherein the gas introduced into the chamber flows through the porous sintered blocker plate and the porous sintered face plate, and wherein a portion of the gas flowing through the porous sintered face plate flows horizontally through the porous sintered face plate before exiting through the exit surface of the porous sintered face plate.

9. The method of claim 8, wherein the step of providing the plasma chamber the porous sintered blocker plate is further characterized as comprising a material selected from the group consisting of aluminum, nickel, and stainless steel.

10. The method of claim 8, wherein the step of providing the plasma chamber the porous sintered blocker plate is further characterized as having a porosity ranging from approximately 0.2 µm to 5 µm.

11. The method of claim 8, wherein the step of providing the plasma chamber the porous sintered blocker plate is further characterized as having a thickness ranging from approximately 0.75 mm to 3.2 mm.

12. The method of claim 8, wherein the step of providing the plasma chamber the porous sintered blocker plate is further characterized as a multilayer plate, wherein a first layer of the multilayer plate has a first pore size, and a second layer of the multilayer plate has a second pore size, and wherein the first pore size is smaller than the second pore size.

13. A method for diffusing gas in a semiconductor process, comprising the steps of:

provividing a plasma chamber, the plasma chamber having a porous sintered blocker plate and a face plate lying therein, the porous sintered blocker plate having an exit surface;

placing a semiconductor wafer in the plasma chamber, wherein the face plate lies between the semiconductor wafer and the porous sintered blocker plate; and introducing a gas into the plasma chamber, wherein the gas flows through the porous sintered blocker plate, and wherein a portion of the gas flowing in the porous sintered blocker plate flows horizontally through the porous sintered blocker plate before exiting the exit surface of the porous sintered blocker plate.

14. The method of claim 13, wherein the step of providing the plasma chamber is further characterized as providing an etch chamber.

15. The method of claim 14, further comprising the step of:

using the gas to etch a layer of material on the semiconductor wafer.

16. The method of claim 13, wherein the step of providing the plasma chamber is further characterized as providing a deposition chamber.

17. The method of claim 16, further comprising the step of:

using the gas to deposit a layer of material on the semiconductor wafer.

18. The method of claim 13, wherein the step of providing the plasma chamber the porous sintered blocker plate is further characterized as a stainless steel blocker plate.

* * * * *